(12) United States Patent
Hwang

(10) Patent No.: US 7,227,181 B2
(45) Date of Patent: Jun. 5, 2007

(54) ORGANIC LIGHT EMITTING DEVICE AND METHOD OF FABRICATING THE SAME

(75) Inventor: Eui-Hoon Hwang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 85 days.

(21) Appl. No.: 11/216,163

(22) Filed: Sep. 1, 2005

(65) Prior Publication Data

US 2006/0043403 A1    Mar. 2, 2006

(30) Foreign Application Priority Data

Sep. 2, 2004  (KR) .................. 10-2004-0070084

(51) Int. Cl.
*H01L 21/28* (2006.01)
*H01L 23/535* (2006.01)

(52) U.S. Cl. .................. 257/40; 438/46; 438/99; 438/637; 257/E51.019; 257/E51.022

(58) Field of Classification Search ............ 438/46, 438/99, 637, FOR. 135; 257/40, 89, E51.019, 257/E51.022
See application file for complete search history.

(56) References Cited

U.S. PATENT DOCUMENTS

| | | | | |
|---|---|---|---|---|
| 6,665,024 | B2* | 12/2003 | Kurashina | 349/39 |
| 6,806,500 | B2* | 10/2004 | Kawata | 257/72 |
| 2001/0048109 | A1* | 12/2001 | Murade | 257/72 |
| 2002/0144583 | A1* | 10/2002 | Kramski | 83/613 |
| 2003/0184705 | A1* | 10/2003 | Murade et al. | 349/158 |
| 2003/0206265 | A1* | 11/2003 | Yasukawa et al. | 349/187 |
| 2003/0234899 | A1* | 12/2003 | Kawata | 349/111 |
| 2004/0041149 | A1* | 3/2004 | Baek et al. | 257/49 |
| 2004/0070708 | A1* | 4/2004 | Kurashina | 349/110 |
| 2004/0218111 | A1* | 11/2004 | Mochizuki | 349/44 |

\* cited by examiner

*Primary Examiner*—George Fourson
(74) *Attorney, Agent, or Firm*—H.C. Park & Associates, PLC

(57) ABSTRACT

An organic light emitting device, and method of fabricating the same, in which a data line, a power line, or a data line and a power line of a unit pixel region are formed in a trench formed in an insulating layer. A first pixel electrode overlaps the trench.

36 Claims, 9 Drawing Sheets

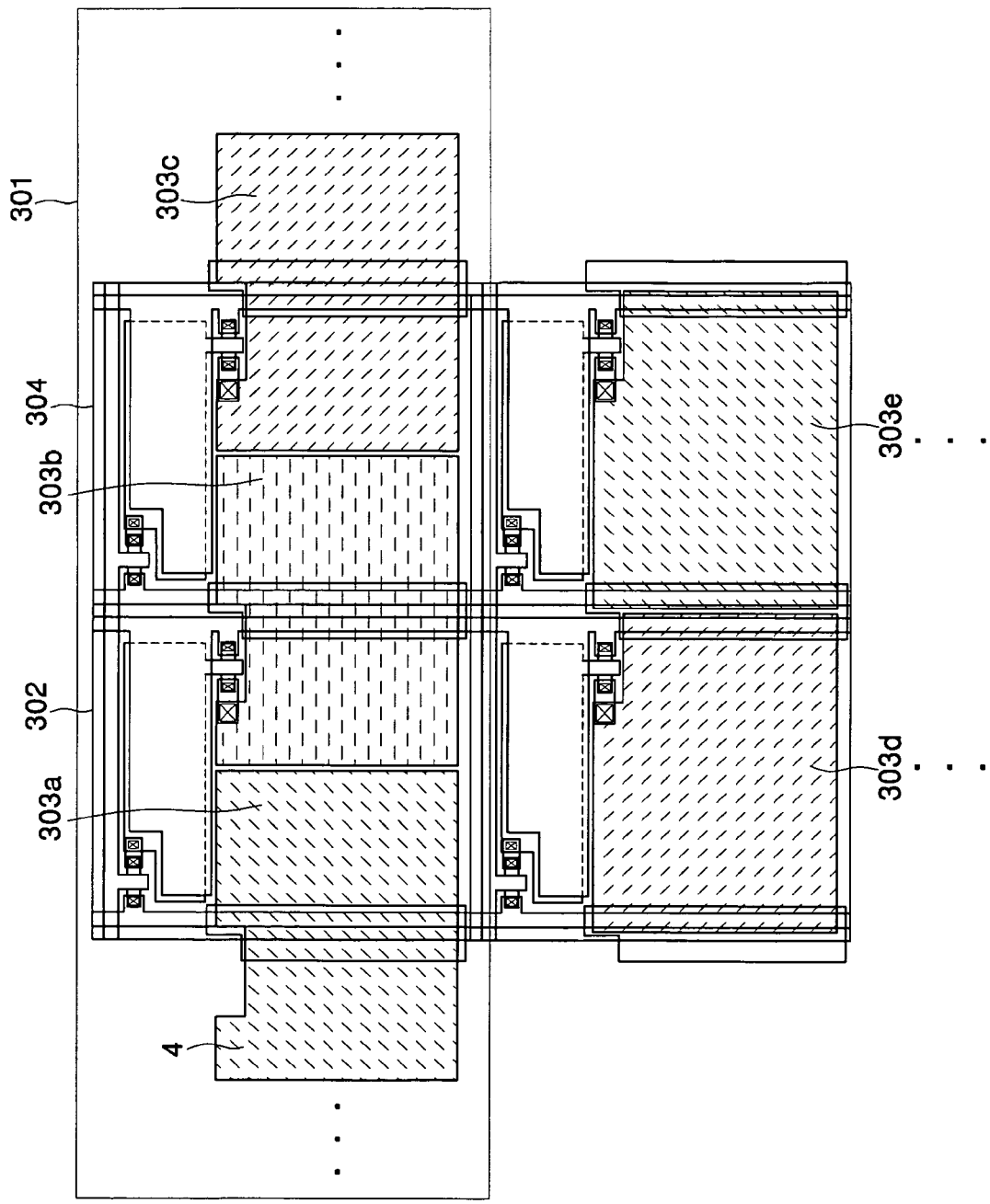

ORGANIC LIGHT EMITTING DEVICE AND METHOD OF FABRICATING THE SAME

CROSS-REFERENCE TO RELATED APPLICATION

This application claims priority to and the benefit of Korean Patent Application No. 2004-70084, filed Sep. 2, 2004, which is hereby incorporated by reference for all purposes as if fully set forth herein.

BACKGROUND OF THE INVENTION

1. Field of the Invention

The present invention relates to an organic light emitting device and method for fabricating the same, and more particularly, to an organic light emitting device, and method for fabricating the same, in which a data line and a power line of a unit pixel region may be formed in a trench and be overlapped by a pixel electrode.

2. Discussion of the Background

Flat panel display devices, including a liquid crystal display (LCD) device, an organic light emitting display device, and a plasma display panel (PDP), have recently received a lot of attention as replacements for large and heavy conventional cathode ray tubes (CRT).

The LCD device is not self-emitting. Therefore, its brightness, contrast, viewing angle and size may be limited. While the PDP is self-emitting, it is generally heavier than other flat panel display devices, it requires high power consumption, and it may be complicated to fabricate. The organic light emitting display device is self-emitting, so that it is advantageous in terms of viewing angle, contrast, etc. Since it does not require a backlight, power consumption may be reduced, and it may be fabricated as a small-sized and light-weight display device.

Additionally, the organic light emitting display device may be driven by a direct current and low voltage, and it has a fast response speed. Furthermore, the organic light emitting display device is made of a solid material, so that it has a wide temperature range, it is not easily damaged by external impact, and it may be fabricated cheaply and easily.

FIG. 1A and FIG. 1B are a plan view and a cross-sectional view showing a conventional organic light emitting device, respectively.

As FIG. 1A shows, a switching thin film transistor (TFT) 15, a driving TFT 16, a capacitor 17, and a first electrode 18 may be formed within a unit pixel region defined by a scan line 12, a data line 13, and a power line 14, which may be formed on a transparent substrate 11 such as plastic or glass. The capacitor 17 supplies a current while the organic light emitting device emits light, and the first electrode 18, which is a pixel electrode, may be electrically connected to either a source or drain electrode of the driving TFT. Although not shown in FIG. 1A, an organic layer including at least an organic emission layer and a common, second electrode may be formed on the first electrode.

FIG. 1B is a cross-sectional view taken along line A–A' of FIG. 1A. As FIG. 1B shows, insulating layers, such as a buffer layer 21, a gate insulating layer 22, and an interlayer insulating layer 23, may be formed on a substrate 11, and a data line 13 and a power line 14 may be formed on the interlayer insulating layer 23. A passivation layer 24 and a planarization layer 25 may be subsequently formed on the data line 13 and the power line 14, and the first electrode 18 may be formed on the planarization layer 25.

In this case, the first electrode 18 may be separated from the data line 13 and the power line 14 by a predetermined interval 31 such that electrical signals do not affect the first electrode 18, thereby preventing crosstalk when supplying electrical signals to the data line 13 and the power line 14. In the conventional organic light emitting device, however, the first electrode 18 may be separated from metal interconnections, such as the data line and the power line, by a predetermined interval, which may decrease the display device's aperture ratio.

SUMMARY OF THE INVENTION

The present invention provides an organic light emitting device and method for fabricating the same, in which the display device may have an increased aperture ratio because a pixel electrode overlaps a data line, or a data line and a power line, on a unit pixel region.

Additional features of the invention will be set forth in the description which follows, and in part will be apparent from the description, or may be learned by practice of the invention.

The present invention discloses an organic light emitting device including a substrate and a plurality of unit pixel regions formed on the substrate. A unit pixel region includes a data line, an insulating layer, and a first electrode. A portion of the data line is formed within a trench formed in the insulating layer, and a portion of the first electrode overlaps the trench.

The present invention also discloses an organic light emitting device including a substrate and a plurality of unit pixel regions formed on the substrate. A unit pixel region includes a data line, a power line, an insulating layer, and a first electrode. A portion of the power line of an $n^{th}$ unit pixel region and a portion of the data line of an $(n+1)^{th}$ unit pixel region are formed within a trench formed in the insulating layer, and a portion of the first electrode overlaps the trench.

The present invention also discloses a method for fabricating an organic light emitting device including preparing a substrate, forming a buffer layer, a gate insulating layer, and an interlayer insulating layer on the substrate, and forming a trench in the buffer layer, the gate insulating layer, and the interlayer insulating layer. A portion of a data line is formed within the trench.

The present invention also discloses a method for fabricating an organic light emitting device including preparing a substrate, forming a buffer layer, a gate insulating layer, and an interlayer insulating layer on the substrate, and forming a trench in the buffer layer, the gate insulating layer, and the interlayer insulating layer. A portion of a data line and a portion of a power line neighboring the data line are formed within the trench.

The present invention also discloses an organic light emitting device including a substrate, and a plurality of unit regions, where a unit region is defined by a scan line, a data line, and a power line formed on the substrate. A first TFT, a second TFT and a capacitor are formed within the unit region. A first electrode coupled with the second TFT and an organic layer, including at least an organic emission layer, and a second electrode are formed on the first electrode. A portion of the data line and a portion of the power line are formed within a trench in an insulating layer. The first electrode is formed within one unit region in a first pixel row and across two unit regions in a second pixel row.

The present invention also discloses a method for fabricating an organic light emitting device including preparing a substrate, forming a buffer layer on the substrate, and forming a gate insulating layer on the buffer layer. A scan line and an interlayer insulating layer are formed on the gate insulating layer, and at least one of the interlayer insulating layer, the buffer layer and the gate insulating layer are etched to form a trench. A portion of a data line and a portion of a power line are formed within the trench. A first pixel electrode formation material is formed on the substrate and patterned to form a first pixel electrode in one unit region in a first pixel row and across two unit regions in a second pixel row. A unit region is defined by the scan line, the data line, and the power line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 7A, FIG. 7B and FIG. 7C are plan views showing organic light emitting devices according to exemplary embodiments of the present invention.

DETAILED DESCRIPTION OF THE ILLUSTRATED EMBODIMENTS

Figure 1A:
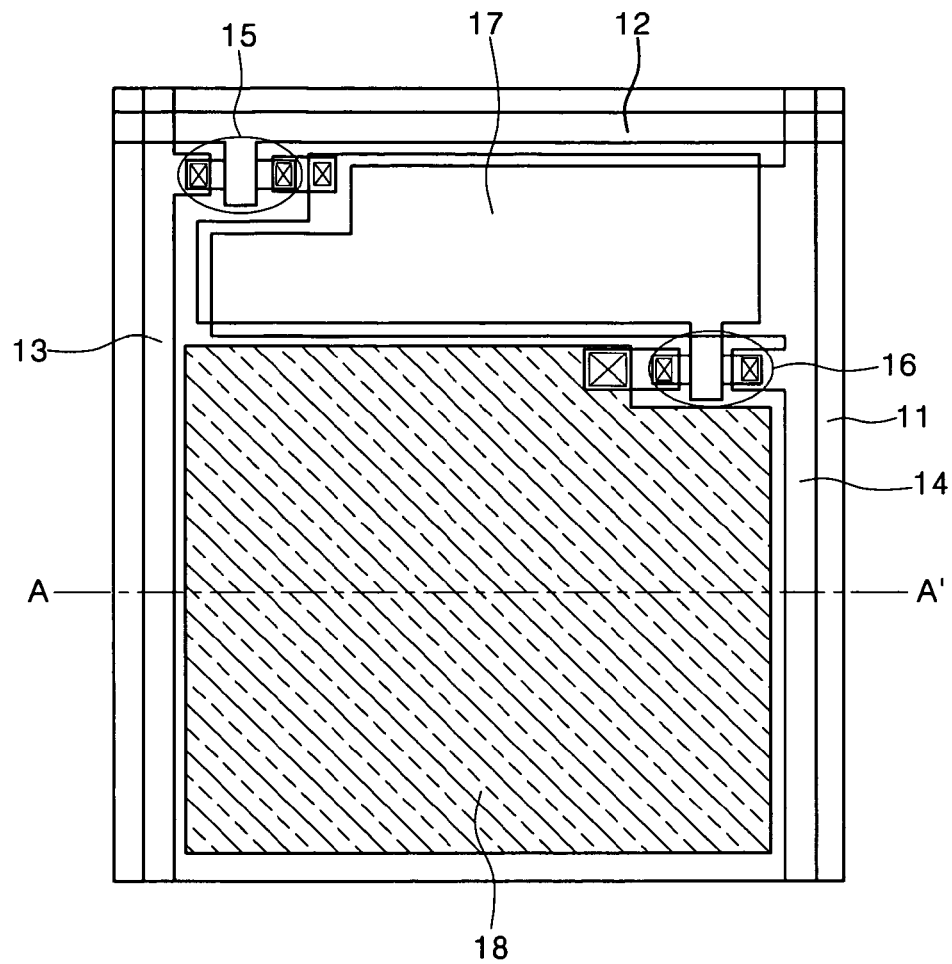
FIG. 1A and FIG. 1B are a plan view and a cross-sectional view showing a conventional organic light emitting device, respectively.
Figure 1B:
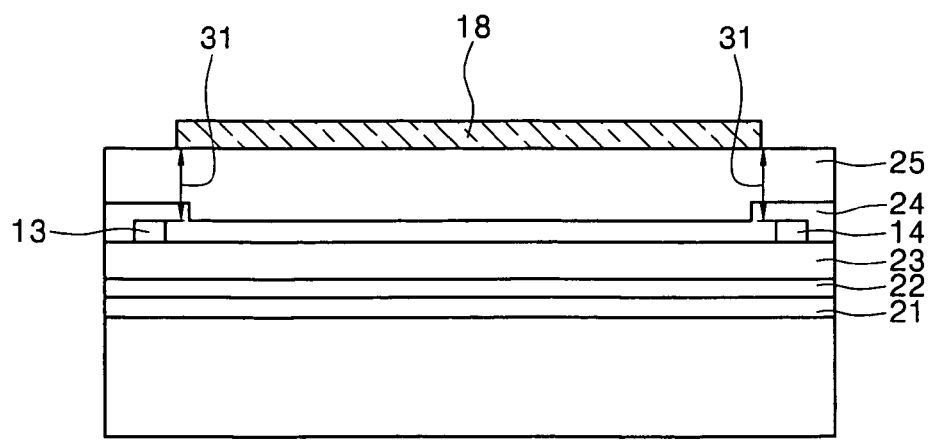

The present invention will now be described more fully hereinafter with reference to the accompanying drawings showing exemplary embodiments of the invention. This invention may, however, be embodied in different forms and should not be construed as limited to the embodiments set forth herein. Rather, these embodiments are provided so that this disclosure is thorough and complete and fully conveys the scope of the invention to those skilled in the art. The thicknesses of layers or regions shown in the drawings are exaggerated for clarity. The same reference numerals are used to denote the same elements throughout the specification.

FIG. 2A, FIG. 2B, FIG. 3A, FIG. 3B, FIG. 4A, FIG. 4B, FIG. 5A, FIG. 5B, FIG. 6A and FIG. 6B are plan views and cross-sectional views showing a process of fabricating an organic light emitting device according to exemplary embodiments of the present invention.

Figure 2A:
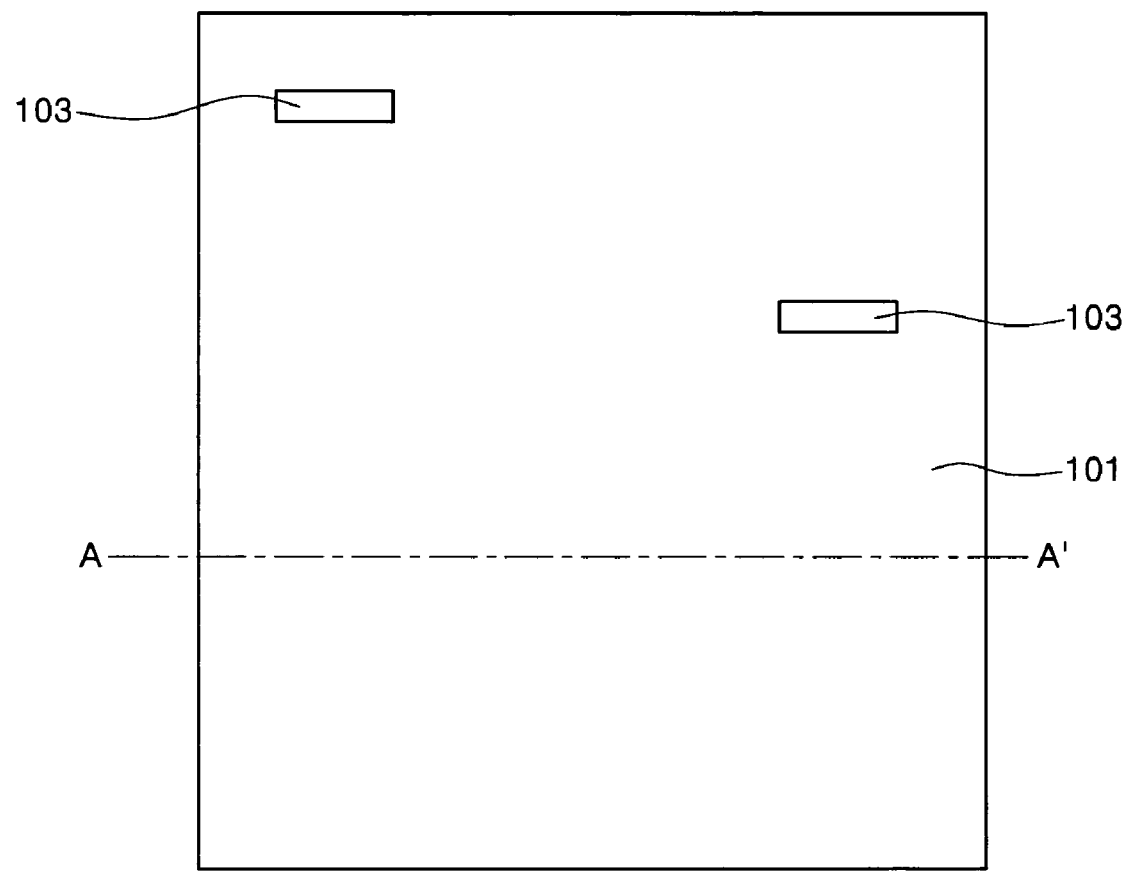
FIG. 2A, FIG. 2B, FIG. 3A, FIG. 3B, FIG. 4A, FIG. 4B, FIG. 5A, FIG. 5B, FIG. 6A and FIG. 6B are plan views and cross-sectional views showing a process of fabricating an organic light emitting device according to an exemplary embodiment of the present invention.
Figure 2B:
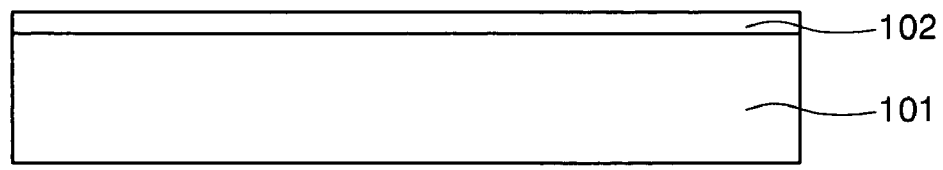

FIG. 2A is a plan view showing a process of forming a buffer layer and a semiconductor layer on a substrate, and FIG. 2B is a cross-sectional view taken along line A–A' of FIG. 2A. As FIG. 2A and FIG. 2B show, a buffer layer 102 may be formed on a substrate 101, which may be made of glass, plastic, or other like materials. The buffer layer 102 serves to prevent impurities, such as gases generated in the substrate 101, from diffusing or penetrating into subsequently formed elements. The buffer layer 102 may be about 1,000 Å to 6,000 Å thick.

An amorphous silicon layer may be formed on the buffer layer 102 using a chemical vapor deposition (CVD) method, a physical vapor deposition (PVD) method, or other like method and then be subjected to dehydrogenation.

The amorphous silicon layer may then be crystallized into a polycrystalline silicon layer by using a crystallization method such as rapid thermal annealing (RTA), solid phase crystallization (SPC), excimer laser crystallization (ELC), metal induced crystallization (MIC), metal induced lateral crystallization (MILC), sequential lateral solidification (SLS), or other like methods. The polycrystalline silicon layer may be patterned to form a semiconductor layer 103.

Figure 3A:
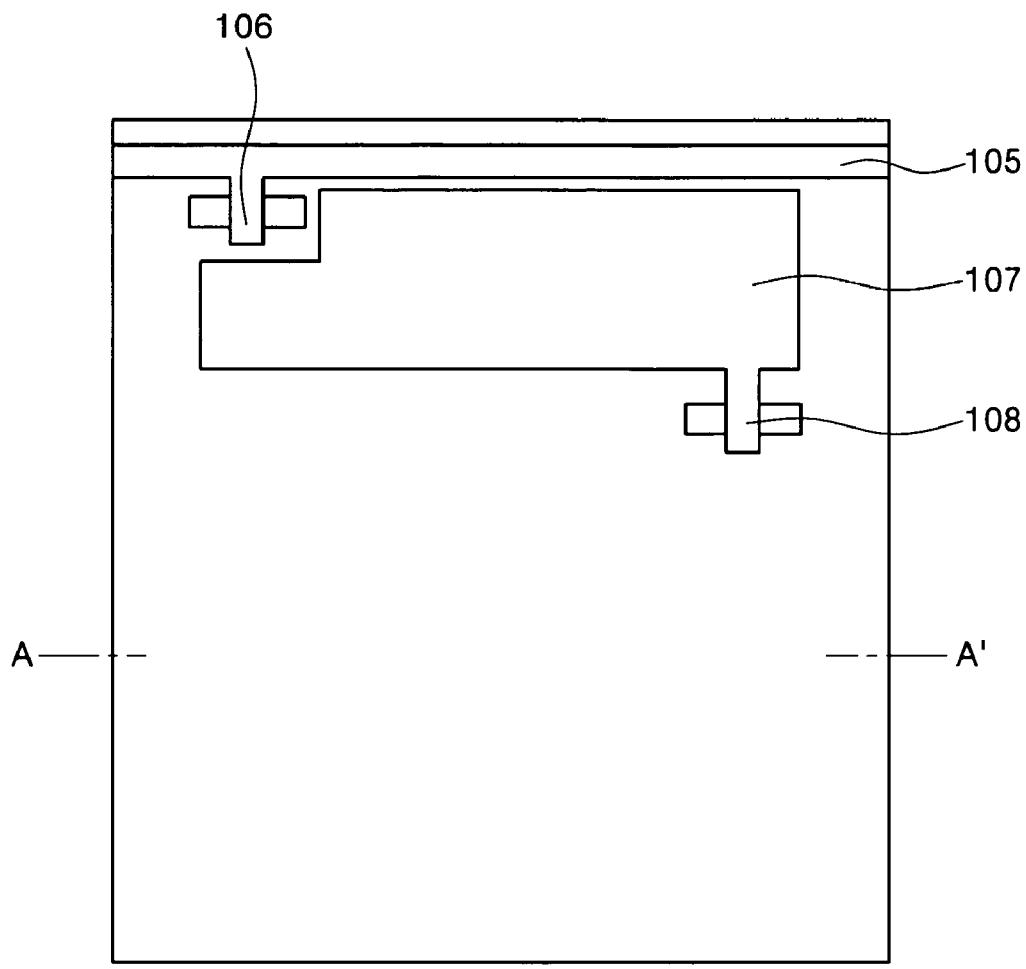
Figure 3B:
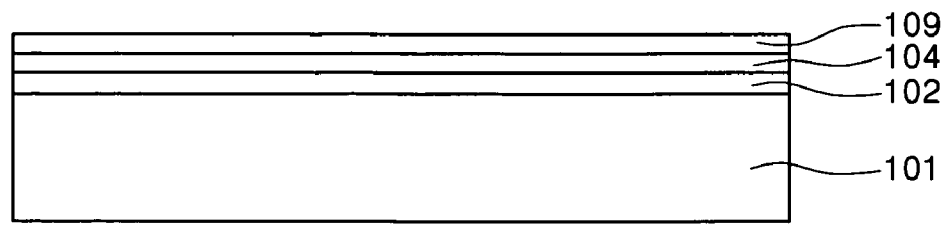

FIG. 3A is a plan view showing a process of forming a gate insulating layer, a first gate electrode, a bottom electrode of a capacitor, and a second gate electrode on a substrate, and FIG. 3B is a cross-sectional view taken along line A–A' of FIG. 3A. As FIG. 3A and FIG. 3B show, a gate insulating layer 104, which may be made of single or multiple silicon oxide or silicon nitride layers, may be formed on the substrate having the semiconductor layer, and a metal material may then deposited on the entire surface of the substrate. The gate insulating layer 104 may be about 500 Å to 2,000 Å thick.

The metal material may then be patterned to form a scan line 105, a first gate electrode 106, a bottom electrode 107 of a capacitor, and a second gate electrode 108.

Ions may then be implanted in the semiconductor layer to form first source and drain regions and second source and drain regions (not shown) in the semiconductor layers (103 of FIG. 2A), respectively.

An interlayer insulating layer 109 may then be formed on the entire surface of the substrate. The interlayer insulating layer 109 may be about 2,000 Å to 6,000 Å thick.

Figure 4A:
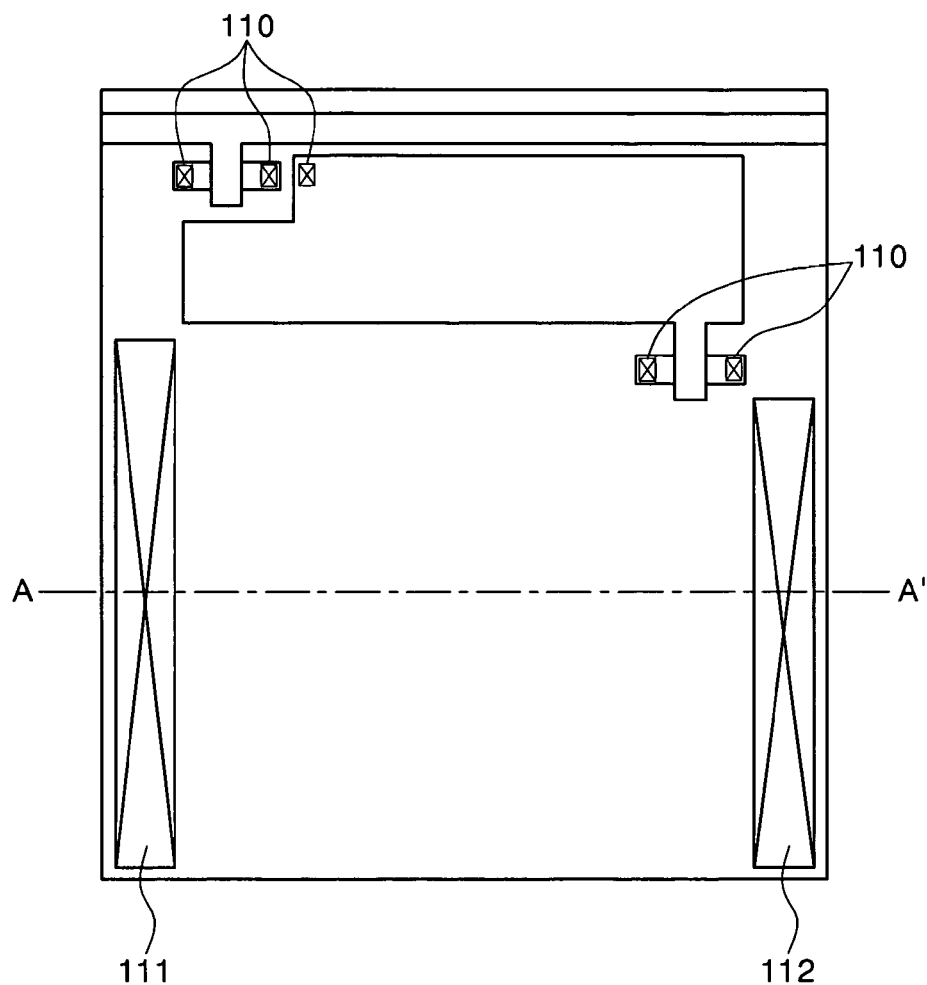
Figure 4B:
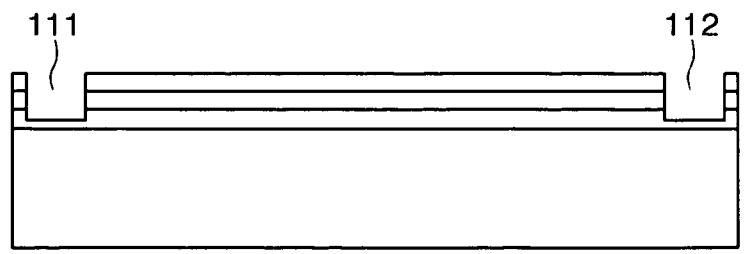

FIG. 4A is a plan view showing a process of forming a contact hole and a trench on a substrate, and FIG. 4B is a cross-sectional view taken along line A–A' of FIG. 4A. As FIG. 4A and FIG. 4B show, portions of the gate insulating layer 104 and the interlayer insulating layer 109 may be etched to form contact holes 110 exposing portions of the first source and drain regions, the second source and drain regions, and the bottom electrode 107. In this case, the gate insulating layer 104 and the interlayer insulating layer 109 together may be about 2,500 Å to 8,000 Å thick. Preferably, their total thickness is in a range of about 4,000 Å to 6,000 Å considering functions of the gate insulating layer 104 and the interlayer insulating layer 109 and facility of the formation process.

Accordingly, the interlayer insulating layer 109 and the gate insulating layer 104 may be completely removed where forming each contact hole 110. The contact hole 110 may be formed using a process condition allowing the thickness to be sufficiently etched (i.e. overetched) compared to the process condition of etching the thickness (4,000 Å to 6,000 Å). That is, while the contact hole 110 is formed, the etching process is performed to remove a thickness of 6,000 Å to 8,000 Å, which may be more than the total thickness of the interlayer insulating layer 109 and the gate insulating layer 104.

Here, a trench of the present invention may be simultaneously formed when forming the contact holes 110. The trench may be formed in a region where a single data line, a single power line, or a data line and a power line are formed. In particular, the trench may include a region that neighbors (or is adjacent to) a first electrode, being a pixel electrode. The trench may overlap with the first electrode when the first electrode is formed to be larger, and it may be formed in a region that is larger than the overlapping region.

When forming the contact hole 110, the same mask may be used to form a data line trench 111, in a data line region, and a power line trench 112, in a power line region. Here, these trenches have a width and length that allows a predetermined region of a data line or a power line to be formed therein. Additionally, they may be etched to a depth that may prevent crosstalk with the subsequently formed first electrode. Here, the trench may be etched to a depth of about 6,000 Å to 8,000 Å, as in the above-described contact hole etching process. The trench may be deeper than 6,000 Å to 8,000 Å because an etch rate of the insulating layers, such as the interlayer insulating layer and the gate insulating layer, is different from that of the semiconductor layer and the bottom electrode of the capacitor, so that an overetch process may be performed to form a deeper trench.

In conclusion, the trench may be formed in the data line region or the power line region when forming the contact holes exposing the bottom electrode of the capacitor and the source and drain regions. Hence, the trench may be formed using the existing process of etching the contact holes. Further, the trench may be formed to have a desired width, length, and depth by adjusting a shape of mask or a process of etching the contact hole. The trench shown in the Figures may be longer and wider, as desired.

Figure 5A:
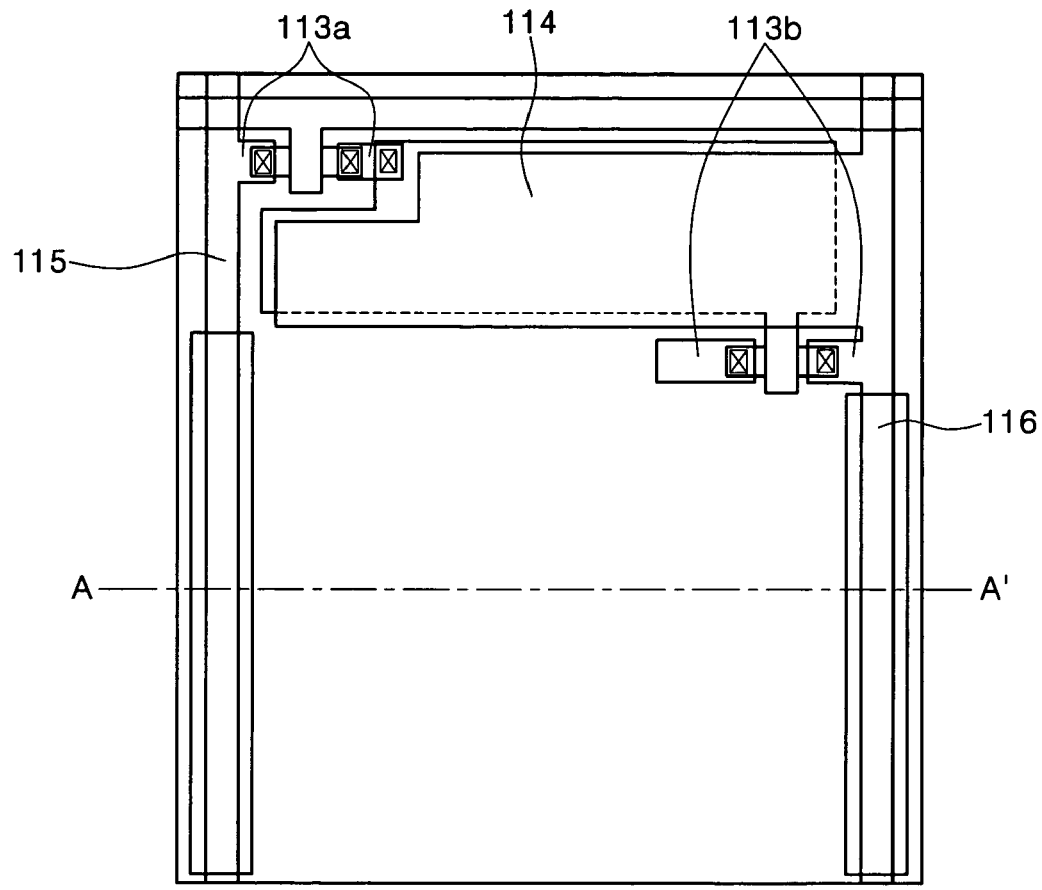
Figure 5B:
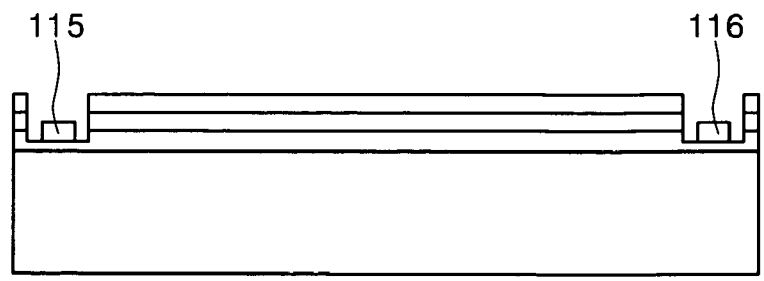

FIG. 5A is a plan view showing a process of forming first source and drain electrodes, second source and drain electrodes, a top electrode of a capacitor, a data line, and a power line on a substrate, and FIG. 5B is a cross-sectional view taken along line A–A' of FIG. 5A. As FIG. 5A and FIG. 5B show, a metal material may be formed on the entire surface of the substrate, having the contact holes and the trenches, and then patterned to form first source and drain electrodes 113a, second source and drain electrodes 113b, a top electrode 114 of a capacitor, a data line 115, and a power line 116.

The first source and drain electrodes 113a complete a first TFT, which is used as a switching TFT, and the second source and drain electrodes 113b complete a second TFT, which is used as a driving TFT.

The metal material formed on the substrate may be about 4,000 Å to 6,000 Å thick. Hence, the data line and the power line may be about 4,000 Å to 6,000 Å thick, so that predetermined regions of the power line and the data line are formed within the trench.

Figure 6A:
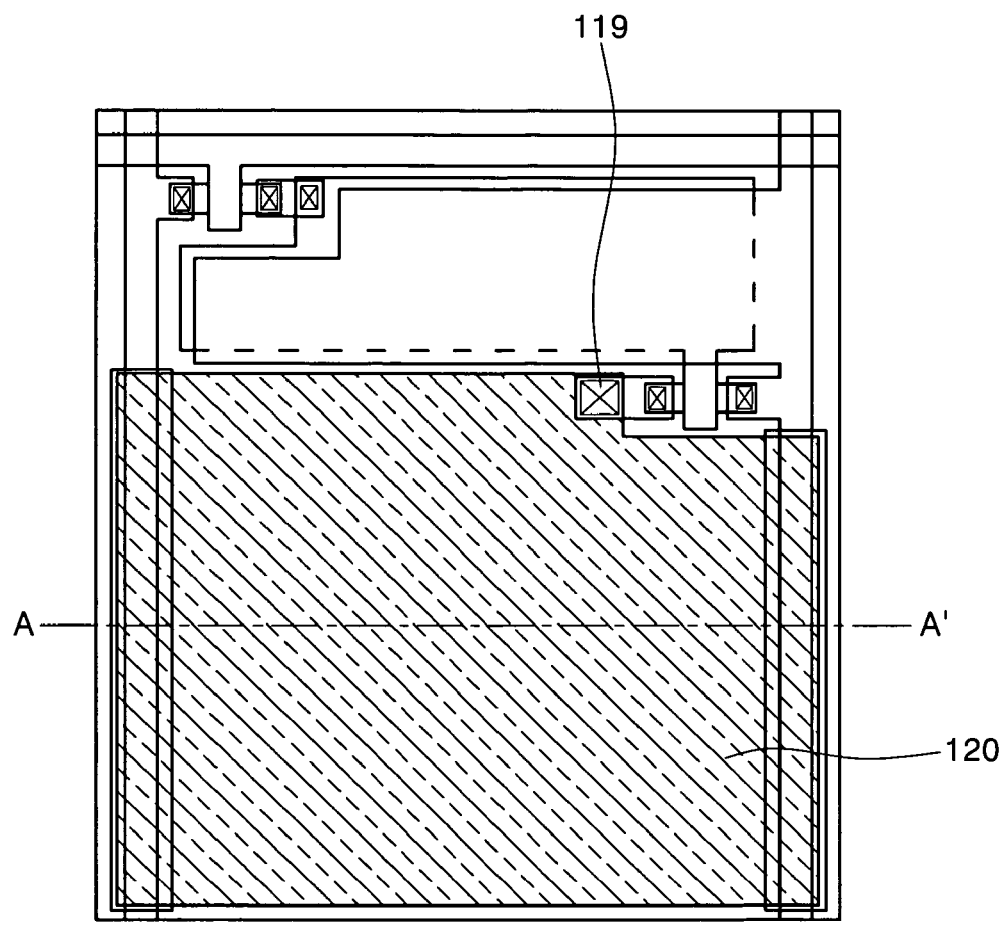
Figure 6B:
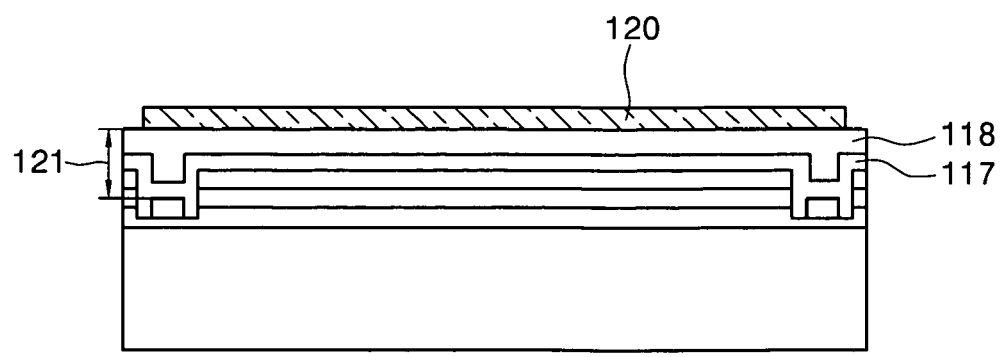

FIG. 6A is a plan view showing a process of forming a passivation layer, a planarization layer, and a first electrode on a substrate, and FIG. 6B is a cross-sectional view taken along line A–A' of FIG. 6A. As FIG. 6A and FIG. 6B show, a passivation layer 117 and a planarization layer 118 may be sequentially formed on the entire surface of the substrate. The passivation layer 117 protects lower elements and may be formed as single or multiple silicon oxide or silicon nitride layers so as to allow a hydrogenation process to be performed. The planarization layer 118 may be formed of an organic material or an inorganic material, and it removes a lower step to planarize the surface of the passivation layer.

The planarization layer 118 and the passivation layer 117 may be etched to form a via hole 119, which exposes either the second source or drain electrode of the driving TFT.

A first electrode formation material may then be formed on the entire surface of the substrate and patterned to form a first electrode 120. Here, the first electrode 120 overlaps the data line and the power line, as shown in FIG. 6A and FIG. 6B. In particular, the data line and the power line are formed within the trench, as described with reference to FIG. 4A, FIG. 4B, FIG. 5A FIG. 5B, so that a distance 121 from the top surface of the data line or the power line to the bottom surface of the first electrode 120 is about 2 μm or more, and preferably 2.3 μm or more. Such distance may prevent crosstalk between the first electrode 120 and the data line or the power line, allowing the first electrode 120 to overlap the data line and the power line.

Assuming that the passivation layer 117 and the planarization layer 118 are equally thick, a distance between the top surface of the data line or the power line and the bottom surface of the first electrode 120 increases as the trench deepens. However, the distance may not exceed a predetermined value because the trench is formed by etching the interlayer insulating layer, the gate insulating layer, and the buffer layer. For example, when the buffer layer is 4,000 Å thick, the gate insulating layer is 1,000 Å thick, the interlayer insulating layer is 4,000 Å thick, the passivation layer is 6,000 Å thick, the planarization layer is 15,000 Å thick, the data line or the power line is 5,000 Å thick, and the trench is 7,000 Å deep (i.e. when the depth is the same as the etched depth of the contact hole), a distance between the first electrode and the data line or the power line becomes 2.3 μm. Additionally, when the trench depth becomes the maximum value (i.e. when the buffer layer, the gate insulating layer, and the interlayer insulating layer are all completely etched), the trench's depth becomes 9,000 Å, and the distance between the first electrode and the data line or the power line becomes 2.5 μm.

Accordingly, the first electrode according to exemplary embodiments of the present invention may have a larger area than the conventional first electrode (e.g. reference numeral 18 of FIG. 1A) because the first electrode of the present invention may overlap the data line and the power line.

An organic layer, including at least an organic emission layer, and a second electrode may then be formed on the first electrode to complete an organic light emitting device.

Figure 7A:
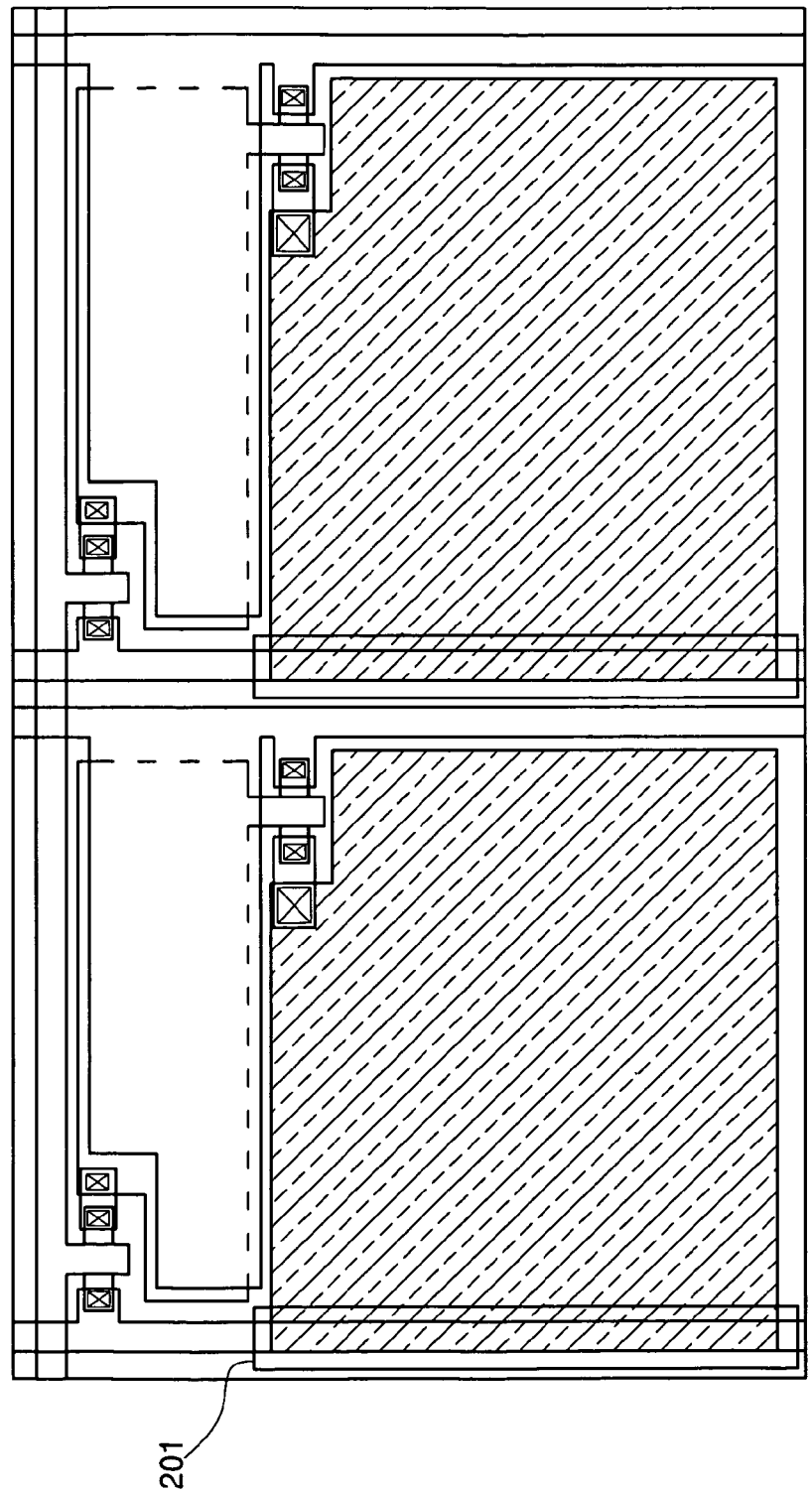
Figure 7B:
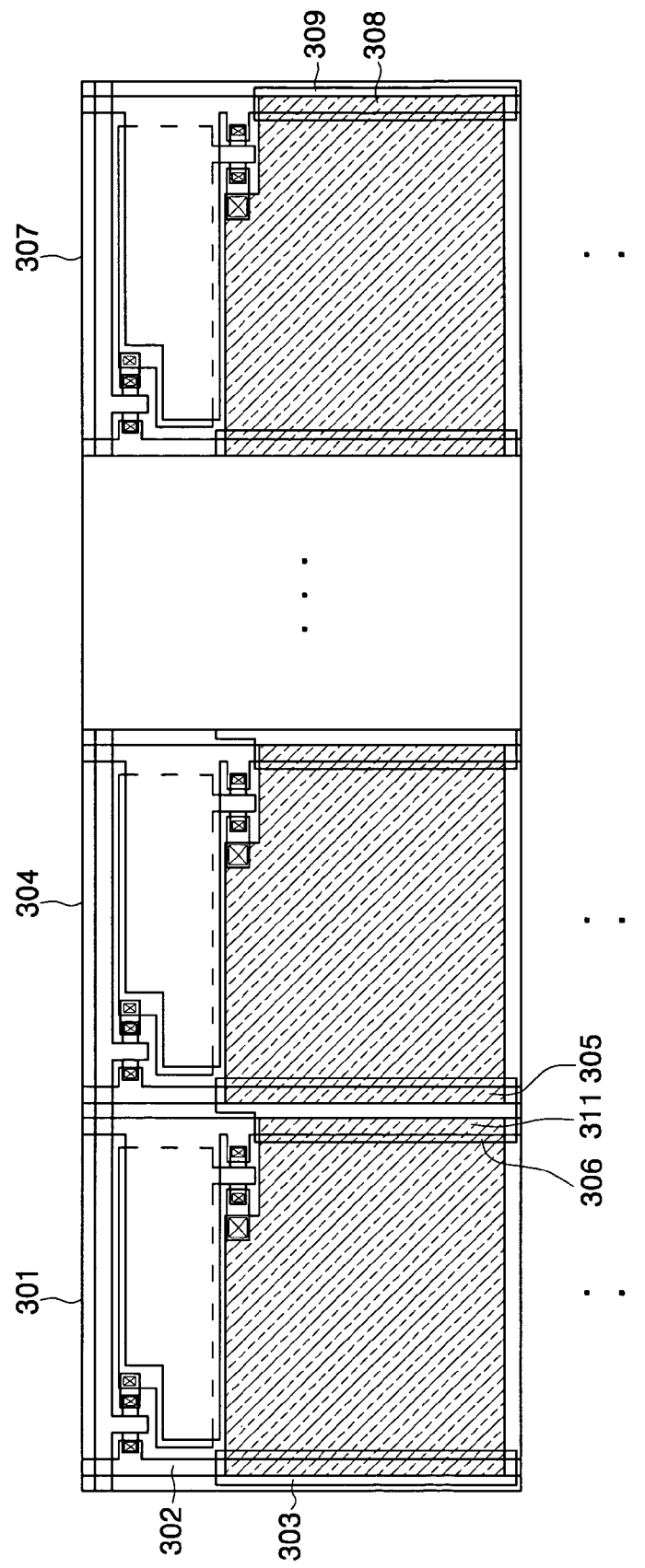

FIG. 7A, FIG. 7B and FIG. 7C are plan views showing organic light emitting devices according to exemplary embodiments of the present invention.

FIG. 7A is a plan view showing an exemplary embodiment of an organic light emitting device according to the present invention. As FIG. 7A shows, the same process as that described with reference to FIGS. 2A to 6B may be used to form the organic light emitting device of FIG. 7A except that only a data line trench 201 is formed in a predetermined region of the data line region and the data line is formed within the data line trench 201.

Accordingly, the organic light emitting device of FIG. 7A has a first electrode only overlapping the data line in a predetermined region of the data line, and the size of an emission region may increase by this overlapped region.

FIG. 7B is a plan view showing an exemplary embodiment of an organic light emitting device according to the present invention. As shown in FIG. 7B, the same process as that described with reference to FIGS. 2A to 6B may be performed to form the organic light emitting device. A data line trench 303 may be formed in a predetermined region of a first data line 302 of a first unit pixel region 301, and a data line and power line trench 306 may be formed in a predetermined region of a second data line 305, of a second unit pixel region 304, and in a predetermined region of a first power line 311, of the first unit pixel region 301. Further, a power line trench 309 may be formed in a predetermined region of a last power line 308 of a last unit pixel region 307.

Accordingly, the data line trench, and the data line and power line trench, may be formed in the first unit pixel region, a data line and power line trench may be formed in predetermined regions of a power line of the $n^{th}$ unit pixel region and a data line of the $(n+1)^{th}$ unit pixel region, and a data line and power line trench, and a power line trench, may be formed in the last unit pixel region (wherein, n is an integer greater than 1). The first electrode overlaps the predetermined regions of the data line and the power line in a unit pixel region, thereby increasing its area to include a region where it overlaps the data line and a region where it overlaps the power line. Hence, the organic light emitting device may have a higher aperture ratio.

FIG. 7C is a plan view showing an exemplary embodiment of an organic light emitting device according to the present invention. As FIG. 7C shows, the same process as that described with reference to FIGS. 2A to 6B may be used to form the organic light emitting device. A first electrode formation material may be deposited and patterned to form the first electrode of a specific row 301, which may be every odd row or every even row, so that the first electrode is formed across neighboring unit pixel regions. That is, as FIG. 7C shows, a first electrode 303b connected to the driving TFT of the $n^{th}$ unit pixel region 302 may be patterned to be also formed across a predetermined region of the $(n+1)^{th}$ unit pixel region 304. On the other hand, a first electrode of the next row may be patterned in a single unit pixel region, as described with reference to FIG. 7A and FIG. 7B.

Accordingly, the first electrodes 303a, 303b, and 303c may be formed across two neighboring unit pixel regions in the specific row 301 (in this case, the unit pixel region is not always equal to the unit pixel). Further, the first electrodes 303d and 303e of the next row may be formed in a single unit pixel region. In this case, three adjacent first electrodes (on which an organic layer including at least an organic emission layer and a second electrode are formed) may define one pixel, which comprises red color (R), green color (G), and blue color (B).

Here, the pixels may be formed in a stripe type or delta type. With the stripe type, the first electrodes 303a, 303b, and 303c define one pixel. Alternatively, with the delta type, the first electrodes 303a, 303b and 303d may define a pixel, the first electrodes 303b, 303c and 303e may define a pixel, or the first electrodes 303b, 303d and 303e may define a pixel. That is, a delta type R, G, B unit pixel may be disposed in a V-shape or an inverted V-shape.

Accordingly, a simple process may be performed to form trenches in predetermined regions of a data line and a power line, which may then be formed within the trenches in accordance with the embodiment of FIG. 7C, which allows not only a high aperture ratio but also a delta type organic light emitting device.

With the organic light emitting device and method of fabricating the same according to exemplary embodiments of the present invention, a trench may be formed on an insulating layer, and a data line, a power line, or a data line and a power line may be formed within the trench, thereby increasing the aperture ratio in a top-emitting or bottom-emitting device. Further, since a vertical distance between the first electrode and a predetermined region of the data line or the power line may be sufficiently ensured, crosstalk may be prevented, and a delta type structure may be implemented without causing significant process changes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
a substrate; and
a plurality of unit pixel regions formed on the substrate,
wherein a unit pixel region includes a scan line, a data line, an insulating layer, and a first electrode,
wherein a portion of the data line is formed within a trench formed in the insulating layer, and a portion of the first electrode overlaps the trench.

2. The organic light emitting device of claim 1, wherein the unit pixel region further comprises:
a first thin film transistor (TFT) and a second TFT;
an organic layer including at least an organic emission layer;
a second electrode;
a capacitor; and
a power line.

3. The organic light emitting device of claim 2, wherein:
the scan line, the data line, and a bottom electrode of the capacitor are coupled with the first TFT;
a top electrode of the capacitor, the power line, and the first electrode are coupled with the second TFT; and
the top electrode of the capacitor is coupled with the power line.

4. The organic light emitting device of claim 1, further comprising a planarization layer and a passivation layer below the first electrode.

5. The organic light emitting device of claim 4, wherein the planarization layer and the passivation layer together are less than 2.0 μm thick.

6. The organic light emitting device of claim 1, wherein a distance between a top surface of the data line and a bottom surface of the first electrode is 2.0 μm or more.

7. The organic light emitting device of claim 1, wherein:
the unit pixel region further comprises a thin film transistor (TFT); and
the trench is simultaneously formed when forming a contact hole for a source electrode and a drain electrode of the TFT.

8. The organic light emitting device of claim 1, wherein the insulating layer comprises an interlayer insulating layer, a gate insulating layer, and a buffer layer.

9. The organic light emitting device of claim 8, wherein:
the interlayer insulating layer is about 2,000 Å to 6,000 Å thick;
the gate insulating layer is about 500 Å to 2,000 Å thick; and
the buffer layer is about 1,000 Å to 6,000 Å thick.

10. The organic light emitting device of claim 1, wherein the trench is about 6,000 Å to 8,000 Å deep.

11. The organic light emitting device of claim 1, wherein a distance from a bottom surface of the trench to a bottom surface of the first electrode is 2.0 μm or more.

12. An organic light emitting device comprising:
a substrate; and
a plurality of unit pixel regions formed on the substrate,
wherein a unit pixel region includes a scan line, a data line, a power line, an insulating layer, and a first electrode,
wherein a portion of the power line of an $n^{th}$ unit pixel region and a portion of the data line of an $(n+1)^{th}$ unit pixel region are formed within a trench formed in the insulating layer, and a portion of the first electrode overlaps the trench.

13. The organic light emitting device of claim 12, wherein the unit pixel region further comprises:
a first thin film transistor (TFT) and a second TFT;

an organic layer including at least an organic emission layer;

a second electrode; and a capacitor.

14. The organic light emitting device of claim 13, wherein:

the scan line, the data line, and a bottom electrode of the capacitor are coupled with the first TFT;

a top electrode of the capacitor, the power line, and the first electrode are coupled with the second TFT; and the top electrode of the capacitor is coupled with the power line.

15. The organic light emitting device of claim 12, further comprising a planarization layer and a passivation layer below the first electrode.

16. The organic light emitting device of claim 15, wherein the planarization layer and the passivation layer together are less than 2.0 μm thick.

17. The organic light emitting device of claim 12, wherein a distance between a top surface of the data line and a bottom surface of the first electrode is 2.0 μm or more.

18. The organic light emitting device of claim 12, wherein:

the unit pixel region further comprises a thin film transistor (TFT); and the trench is simultaneously formed when forming a contact hole for a source electrode and a drain electrode of the TFT.

19. The organic light emitting device of claim 12, wherein the insulating layer comprises an interlayer insulating layer, a gate insulating layer, and a buffer layer.

20. The organic light emitting device of claim 19, wherein:

the interlayer insulating layer is about 2,000 Å to 6,000 Å thick;

the gate insulating layer is about 500 Å to 2,000 Å thick; and the buffer layer is about 1,000 Å to 6,000 Å thick.

21. The organic light emitting device of claim 12, wherein the trench is about 6,000 Å to 8,000 Å deep.

22. The organic light emitting device of claim 12, wherein a distance from a bottom surface of the trench to a bottom surface of the first electrode is 2.0 μm or more.

23. A method of fabricating an organic light emitting device, comprising:

preparing a substrate;

forming a buffer layer, a gate insulating layer, and an interlayer insulating layer on the substrate;

forming a trench in the buffer layer, the gate insulating layer, and the interlayer insulating layer; and forming a portion of a data line within the trench.

24. A method of fabricating an organic light emitting device, comprising:

preparing a substrate;

forming a buffer layer, a gate insulating layer, and an interlayer insulating layer on the substrate;

forming a trench in the buffer layer, the gate insulating layer, and the interlayer insulating layer; and forming a portion of a data line and a portion of a power line neighboring the data line within the trench.

25. An organic light emitting device, comprising:

a substrate;

a plurality of unit regions, where a unit region is defined by a scan line, a data line, and a power line formed on the substrate;

a first thin film transistor (TFT), a second TFT, and a capacitor within the unit region;

a first electrode coupled with the second TFT; and an organic layer, including at least an organic emission layer, and a second electrode formed on the first electrode, wherein a portion of the data line and a portion of the power line are formed within a trench in an insulating layer, and wherein the first electrode is formed within one unit region in a first pixel row and across two unit regions in a second pixel row.

26. The organic light emitting device of claim 25, wherein the portion of the data line and the portion of the power line formed within the trench are larger than a region of the data line and a region of the power line that are overlapped by the first electrode.

27. The organic light emitting device of claim 25, wherein the first electrode is one pixel electrode of red, green, and blue color unit pixels.

28. The organic light emitting device of claim 25, wherein the insulating layer comprises an interlayer insulating layer, a gate insulating layer, and a buffer layer.

29. The organic light emitting device of claim 28, wherein:

the interlayer insulating layer is about 2,000 Å to 6,000 Å thick;

the gate insulating layer is about 500 Å to 2,000 Å thick; and the buffer layer is about 1,000 Å to 6,000 Å thick.

30. The organic light emitting device of claim 25, further comprising a planarization layer and a passivation layer below the first electrode.

31. The organic light emitting device of claim 30, wherein the planarization layer and the passivation layer together are less than 2.0 μm thick.

32. The organic light emitting device of claim 25, wherein a distance between a top surface of the data line and a bottom surface of the first electrode is 2.0 μm or more.

33. The organic light emitting device of claim 25, wherein the trench is simultaneously formed when forming a contact hole for a source electrode and a drain electrode of the TFT.

34. The organic light emitting device of claim 25, wherein the trench is about 6,000 Å to 8,000 Å deep.

35. The organic light emitting device of claim 25, wherein a distance from a bottom surface of the trench to a bottom surface of the first electrode is 2.0 μm or more.

36. A method of fabricating an organic light emitting device, comprising:

preparing a substrate;

forming a buffer layer on the substrate;

forming a gate insulating layer on the buffer layer;

forming a scan line and an interlayer insulating layer on the gate insulating layer;

etching at least one of the interlayer insulating layer, the buffer layer and the gate insulating layer to form a trench;

forming a portion of a data line and a portion of a power line within the trench;

forming a first pixel electrode formation material on the substrate; and patterning the first pixel electrode formation material to form a first pixel electrode in one unit region in a first pixel row and across two unit regions in a second pixel row, wherein a unit region is defined by the scan line, the data line, and the power line.

* * * * *